(12) United States Patent  
Batruni

(10) Patent No.: US 8,380,773 B2
(45) Date of Patent: Feb. 19, 2013

(54) SYSTEM AND METHOD FOR ADAPTIVE NONLINEAR FILTERING

(75) Inventor: Roy G. Batruni, Danville, CA (US)

(73) Assignee: Netlogic Microsystems, Inc., Irvine, CA (US)

( * ) Notice: Subject to any disclaimer, the term of this patent is extended or adjusted under 35 U.S.C. 154(b) by 928 days.

(21) Appl. No.: 12/286,733

(22) Filed: Sep. 30, 2008

(65) Prior Publication Data

US 2009/0094304 A1    Apr. 9, 2009

Related U.S. Application Data

(63) Continuation-in-part of application No. 11/061,850, filed on Feb. 18, 2005, now Pat. No. 7,613,759.

(60) Provisional application No. 60/998,057, filed on Oct. 4, 2007.

(51) Int. Cl.
*G06F 17/10* (2006.01)
(52) U.S. Cl. ...................................................... 708/322
(58) Field of Classification Search .................... 708/322
See application file for complete search history.

(56) References Cited

U.S. PATENT DOCUMENTS

| | | | |
|---|---|---|---|
| 4,887,306 A | 12/1989 | Hwang et al. |
| 5,243,624 A | 9/1993 | Paik et al. |
| 5,311,435 A | 5/1994 | Yocum et al. |
| 5,483,439 A | 1/1996 | Ono et al. |
| 5,563,954 A | 10/1996 | Ono et al. |
| 5,775,293 A | 7/1998 | Kresse |
| 5,859,773 A | 1/1999 | Keeler et al. |
| 6,285,971 B1 | 9/2001 | Shah et al. |
| 6,765,931 B1 | 7/2004 | Rabenko et al. |
| 6,856,191 B2 | 2/2005 | Bartuni |
| 6,885,323 B2 | 4/2005 | Batruni |
| 6,999,510 B2 | 2/2006 | Batruni |
| 7,165,465 B2 | 1/2007 | DeLair et al. |
| 7,460,916 B2 | 12/2008 | Batruni |
| 7,467,172 B2 | 12/2008 | Druck |
| 7,689,297 B2 | 3/2010 | Batruni |
| 7,869,550 B2 | 1/2011 | Batruni |
| 2002/0169585 A1 | 11/2002 | Jones et al. |
| 2002/0178133 A1 | 11/2002 | Zhao et al. |
| 2004/0164791 A1 | 8/2004 | Batruni |
| 2005/0212589 A1 | 9/2005 | Batruni |
| 2005/0212596 A1 | 9/2005 | Batruni |
| 2006/0061493 A1 | 3/2006 | Larson et al. |
| 2006/0122714 A1 | 6/2006 | Batruni |
| 2006/0176989 A1 | 8/2006 | Jensen |
| 2006/0215064 A1 | 9/2006 | Dawson et al. |
| 2006/0245583 A1* | 11/2006 | Mizushima et al. ..... 379/406.01 |
| 2008/0080644 A1 | 4/2008 | Batruni |
| 2008/0095264 A1 | 4/2008 | Deng et al. |
| 2009/0054999 A1 | 2/2009 | Batruni |

FOREIGN PATENT DOCUMENTS

| CN | 1754315 A | 3/2006 |
|---|---|---|
| CN | 1870614 A | 11/2006 |

OTHER PUBLICATIONS

U.S. Appl. No. 11/246,914 Office Action Mailed Jan. 22, 2008.
U.S. Appl. No. 12/288,783 Office Action Mailed May 27, 2009.
Chinese Office Action dated Mar. 12, 2012, issued in related Chinese Application No. CN 200880114456.3.

* cited by examiner

*Primary Examiner* — Tan V. Mai

(74) *Attorney, Agent, or Firm* — Sterne, Kessler, Goldstein & Fox PLLC

(57) ABSTRACT

An adaptive nonlinear filtering system includes an adaptive filter module that is configured to generate relative location information pertaining to a relative location of an input signal within an input range; determine an input dependent filter parameter based at least in part on the relative location information; generate an output signal based at least in part on the input dependent filter parameter; and feed back a feedback signal that is generated based at least in part on the output signal and a target signal.

28 Claims, 10 Drawing Sheets

SYSTEM AND METHOD FOR ADAPTIVE NONLINEAR FILTERING

CROSS REFERENCE TO OTHER APPLICATIONS

This application is a continuation in part of U.S. patent application Ser. No. 11/061,850 entitled LOW-COMPLEXITY NONLINEAR FILTERS filed Feb. 18, 2005, now U.S. Pat. No. 7,613,759 which is incorporated herein by reference for all purposes.

This application claims priority to U.S. Provisional Patent Application No. 60/998,057 entitled CANONICAL NONLINEAR FILTER filed Oct. 4, 2007 which is incorporated herein by reference for all purposes.

BACKGROUND OF THE INVENTION

FIG. 1A is a block diagram illustrating a signal model of a typical system. An input x is sent to system 100, which applies a function F to x to generate an output y. Since it is possible for the function to vary over time, F is also dependent on time t. In many systems, it is desirable for the system function $F(x, t)$ to be linear. FIG. 1B is a three-dimensional (3-D) diagram illustrating a linear relationship between the input x, the output y, and time t. In this ideal case the input and the output have a linear relationship that is constant throughout time t. Thus, function $y=F(x, t)$ forms a plane in the 3-D diagram.

It is common, however, for the system to be nonlinear. There are many possible causes for system nonlinearities, including characteristics of nonlinear components (such as conductors, capacitors and transistors), the input signal's frequency subrange, history and rate of change (also referred to as "slew rate"), as well as external factors such as operating temperature. FIG. 1C is a 3-D diagram illustrating a typical nonlinear relationship. In this example, not only is the relationship between input x and output y nonlinear, this nonlinear relationship changes over time, as illustrated by sample functions $F1(x, t1)$, $F2(x, t2)$, and $F3(x, t3)$. Thus, the function $y=F(x, t)$ forms a nonlinear manifold. It is often useful to have filters that can implement this type of nonlinear functions. Many existing nonlinear filters, however, are complex, expensive, and unstable.

BRIEF DESCRIPTION OF THE DRAWINGS

Various embodiments of the invention are disclosed in the following detailed description and the accompanying drawings.

DETAILED DESCRIPTION

Figure 1A:
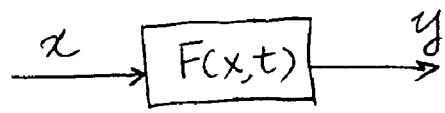
FIG. 1A is a block diagram illustrating a signal model of a typical system.
Figure 1B:
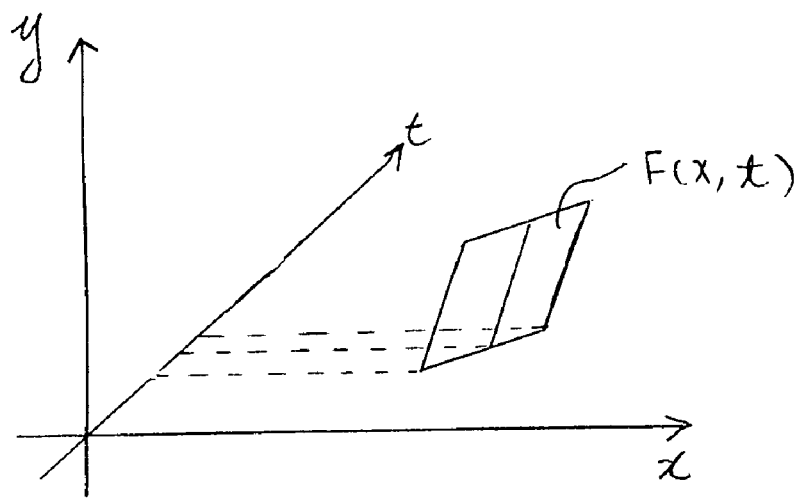
FIG. 1B is a three-dimensional (3-D) diagram illustrating a linear relationship between the input x, the output y, and time t.
Figure 1C:
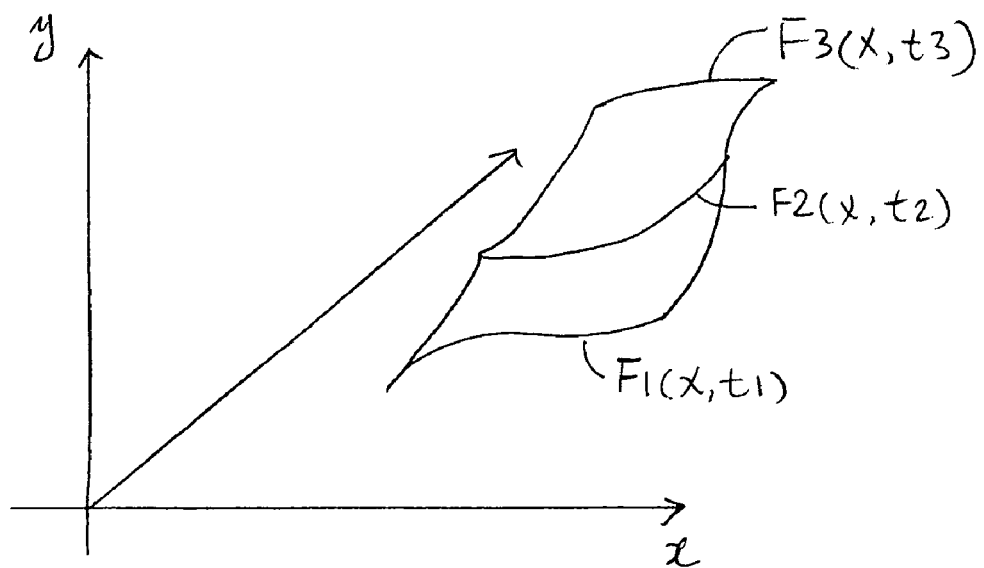
FIG. 1C is a 3-D diagram illustrating a typical nonlinear relationship.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A nonlinear adaptive filter is disclosed. In some embodiments, the nonlinear adaptive filter includes interfaces for receiving an input signal and a target signal. It further includes an adaptive filter module that is configured to generate relative location information pertaining to a relative location of the input signal within a possible range of inputs. A thermometer code address generator is used in some embodiments to generate the relative location information. The relative location information is used to determine input dependent filter parameters. In some embodiments, the relative location information includes a thermometer coded address vector, which is used to select input dependent filter parameters from a plurality of memory banks. In some embodiments, the input dependent filter parameters include filter coefficients that are used to generate an output signal. A feedback signal is generated based at least in part on an output signal and the target signal. Stored input dependent filter parameters are adapted based on the feedback signal.

Figure 2:
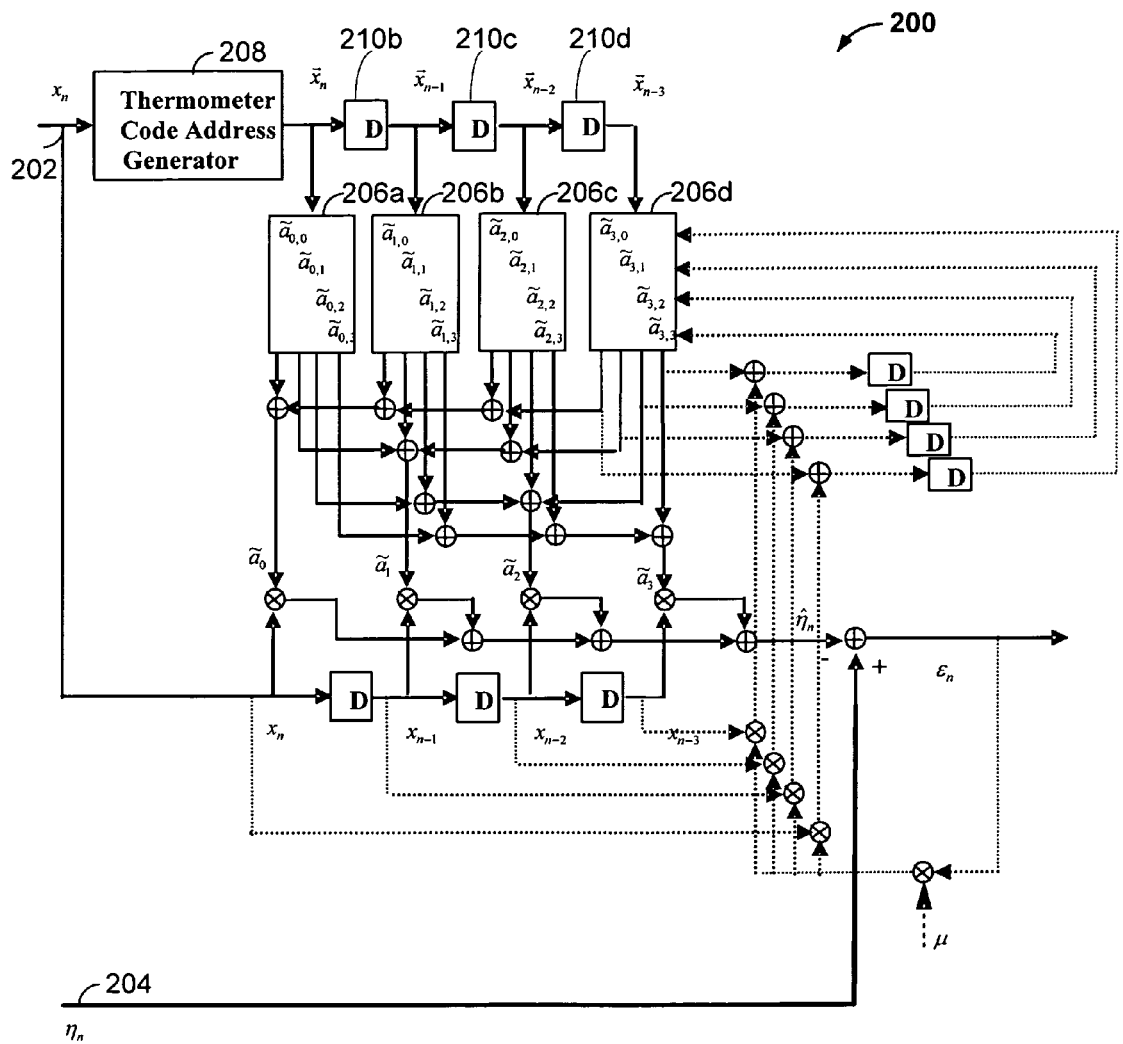
FIG. 2 is a block diagram illustrating an embodiment of a nonlinear adaptive filter.

FIG. 2 is a block diagram illustrating an embodiment of a nonlinear adaptive filter. In this example, nonlinear adaptive filter 200 implements a nonlinear filter function expressed as:

$$y_n = \tilde{a}_0(X_n)x_n + \tilde{a}_1(X_n)x_{n-1} + \ldots + \tilde{a}_{N-1}(X_n)x_{n-N+1} \quad [1]$$

where $X_n = [x_n \ldots x_{n-N+1}]$.

The above nonlinear filter function has filter taps with coefficients $\tilde{a}_k$ that depend on the present input sample as well as previous input samples. In some embodiments, each coefficient is implemented as a constant plus a nonlinear function of the signal. As will be discussed in detail below, these coefficients are adaptable to achieve the desired filter response, such as a filter response that is a nonlinear function.

An alternative expression for equation [1] is:

$$y_n = [\tilde{A}_0(x_n) + \tilde{A}_1(x_{n-1}) + \ldots + \tilde{A}_{N-1}(x_{n-N+1})]X_n = \quad [2]$$

$$\left[\sum_{j=0}^{N-1} \tilde{A}_j(x_{n-j})\right]X_n = \tilde{A}_n(X_n)X_n$$

where $\tilde{A}_j = (x_{n-j}) = [\tilde{a}_{j,0}(x_{n-j})\tilde{a}_{j,1}(x_{n-j}) \ldots \tilde{a}_{j,N-1}(x_{n-j})]$.

The above equations indicate that each filter tap coefficient can be expressed as a sum of sub-taps $$\left(\text{i.e. } \sum_{j=0}^{N-1} \tilde{A}_j(x_{n-j})\right),$$

and each sub-tap $\tilde{A}_j(x_{n-j})$ in turn is a different function of $x_{n-j}$. Equivalently, the coefficient of the k-th filter tap can be expressed as:

$$\tilde{a}_k(X_n) = \left[\sum_{j=0}^{N-1} \tilde{a}_{j,k}(x_{n-j})\right]. \quad [3]$$

Returning to FIG. 2, nonlinear adaptive filter 200 includes a first input interface 202 on which an input digital signal $x_n$ is received, and a second input interface 204 on which the target signal $\eta_n$ is received. As will be discussed in greater detail below, the filter adapts its coefficients so that its output $\hat{\eta}_n$ tracks the target signal $\eta_n$. In other words, the filter adapts until the difference between its output is $\hat{\eta}_n$ and the target signal $\eta_n$ is within a predefined value.

The values of filter coefficients $\tilde{a}_0$, $\tilde{a}_1$, $\tilde{a}_2$, and $\tilde{a}_3$ each depend on the present input sample as well as past input samples (sometimes also referred to as delayed input samples or the input signal's history). The coefficient values are computed based at least in part on sums of selected, pre-stored values. In this example, the values are selected from appropriate storage locations within a plurality of memory banks. System 200 includes memory banks 206a, 206b, 206c, and 206d that correspond to filter taps 0, 1, 2, and 3, respectively. Although four memory banks are shown for purposes of example, the number of memory banks depends on the number of filter taps N and may vary in other embodiments. The memory banks may be implemented using one or more memory devices of any appropriate type, such as registers, buffers, DRAM, SRAM, etc. The memory banks represent the logical organization of memory used to store filter parameters. In some embodiments, the memory banks are implemented using M physical memory devices where M does not necessarily correspond to N. For example, all four memory banks shown in system 200 may be implemented using a single memory device such as a single EEPROM or RAM chip.

According to this example, each memory bank stores N sets of values (N=number of taps) that contribute to the N filter coefficients. Each set of values is implemented as a coefficient vector that includes S entries. The value of S depends on the granularity or precision of the nonlinear function being implemented. For example, if the nonlinear function is such that for all input values $\beta_{min} < x_{n-j} \leq \beta_0$ (where $\beta_{min}$ is the minimum expected input value, and $\beta_0$ is a predefined value), coefficient function $\tilde{A}_{n-j}(x_{n-j})$ maps to one set of vector values, and for all input values $\beta_0 < x_{n-j} < \beta_{max}$ (where $\beta_{max}$ is the maximum expected input value), the coefficient function maps to another set of vector values, then the coefficient function is said to have a granularity of 2 and each set of coefficient vector includes two entries. In the example shown in FIG. 2, the possible inputs are divided into four subranges $\beta_{min} < x_{n-j} \leq \beta_0$, $\beta_0 < x_{n-j} \leq \beta_1$, and $\beta_1 < x_{n-j} \leq \beta_2$, and $\beta_2 < x_{n-j} \leq \beta_{max}$, which map to four possible coefficient vectors $\tilde{a}_{n-j,0}$, $\tilde{a}_{n-j,1}$, $\tilde{a}_{n-j,2}$, and $\tilde{a}_{n-j,3}$, respectively. Thus, the coefficient function has a granularity of 4 and A memory bank therefore stores 4 coefficient vectors $\tilde{a}_{n-j,0}$, $\tilde{a}_{n-j,1}$, $\tilde{a}_{n-j,2}$, and $\tilde{a}_{n-j,3}$. More generally, if all the possible input values are divided into S subranges and each input subrange maps to a corresponding coefficient vector (i.e., a granularity of S), then each vector in the memory bank stores S entries.

A thermometer code address generator 208 is used to facilitate the selection of the appropriate coefficient vector from the memory banks. The thermometer code address generator indicates the relative location of the input signal within the range of possible input signals. In some embodiments, the thermometer code address generator includes one or more comparators that compare the input with certain predefined subranges, and one or more multiplexers that map the output of the comparators to an appropriate address vector. The address vector indicates the relative location of the input signal within the possible input range. In some embodiments, the address vector has at most one sign change between any two adjacent entries.

The thermometer code address generator is configured to divide the possible range of inputs $\vec{\beta} = \{\beta_{min}, \beta_{max}\}$ into S subsubranges. The values in these subsubranges may be distributed evenly, logarithmically, exponentially, or in any other appropriate ways. Upon receiving an input value $x_{n-j}$, the thermometer code address generator applies the following coding function to generate the appropriate output vector:

$$\vec{x}_{n-j} = \text{Sign}(x_{n-j} - \vec{\beta}) \quad [4]$$

Based on the thermometer coder output, the set of values that corresponds to the fist positive location in vector $\vec{x}_{n-j}$ is selected from the memory bank. The output of the thermometer code address generator is delayed by delay blocks 210b, 210c, and 210d. The delayed values are used to select the appropriate stored coefficient vectors from corresponding memory banks. At each filter tap n−j, selected values from the filter banks (the "sub-taps") are summed to generate the corresponding coefficient value $\tilde{a}_{n-j}$. In some alternative embodiments, the thermometer code address generator directly determines which coefficient values in the memory bank should be selected.

Figure 3:
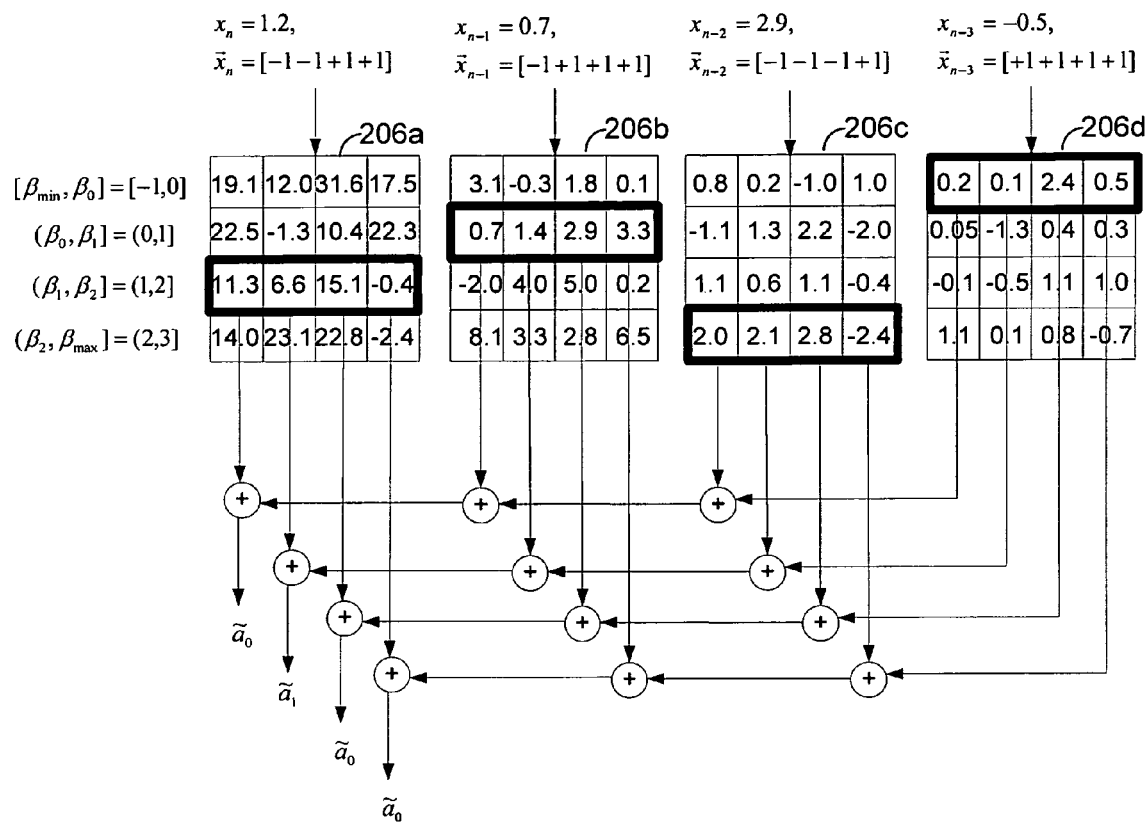
FIG. 3 is a diagram illustrating in greater detail an example implementation of memory banks 206a-206d of FIG. 2.

FIG. 3 is a diagram illustrating in greater detail an example implementation of memory banks 206a-206d of FIG. 2. The figure gives a numerical example of how to compute coefficients $\tilde{a}_{n-j}$. In this example, memory banks 206a-206d are implemented as four 4×4 matrices. Other implementations are possible in other embodiments. Four rows of the matrices map to 4 input subranges, which are [−1, 0], (0, 1], (1, 2], and (2, 3]. Each row is a vector with 4 entries. In this example, $x_n=1.2$, which falls in the subrange of (1, 2], and corresponds to a thermometer code address generator output of [−1 −1 +1 +1]. Thus, $ã_{0,2}$, the third row from memory bank 206a, is selected. Similarly, given $x_{n−1}=0.7$, $x_{n−2}=2.9$, and $x_{n−3}=-0.5$, the corresponding thermometer code address generator outputs are $\vec{x}_{n-1}=[-1\ +1\ +1\ +1]$, $\vec{x}_{n-2}=[-1\ -1\ -1\ +1]$, and $\vec{x}_{n-3}=[+1\ +1\ +1\ +1]$, respectively. The second row of memory bank 206b ($ã_{1,1}$), the last row of memory bank 206c ($ã_{2,3}$), and the first row of memory bank 206d ($ã_{3,0}$) are selected accordingly.

To generate a filter coefficient for a filter tap, the corresponding entries from the selected rows are summed. In this example, the 0-th entries of the selected rows (i.e., 11.3, 0.7, 2.0, 0.2) are the values selected and summed to generate coefficient $ã_0$ for the tap 0. Similarly, 6.6, 1.4, 2.1, and 0.1 are the values selected and summed to generate coefficient $ã_0$ for tap 1, and so on.

Returning to FIG. 2, the input samples are multiplied with the filter coefficients, generating a filter output which expressed as:

$$y_n = \hat{\eta}_n = \sum_{j=0}^{N-1} ã_j x_{n-j} \qquad [5]$$

A target signal $\eta_n$ is received on interface 204. How the target signal is obtained depends on system configuration and is described in greater detail in FIGS. 10A-10C below. In example system 200, the output is subtracted from a target signal $\eta_n$ to obtain an error $\epsilon_n$. The input signal is multiplied with the error as well as an update coefficient μ, and the result is fed back to adapt the filter coefficients. In some embodiments, the initial value of μ is arbitrarily selected. During the adaptation process, μ is continuously adjusted to adapt the filter coefficients and reduce output error, according to techniques such as least mean squared error (LMSE). The update function of adaptive filter 200 is expressed as:

$$ã_j(\vec{X}_n) = ã_j(\vec{X}_n) + \mu \epsilon_n X_n \qquad [6]$$

where $$\vec{X}_n[\vec{x}_n \vec{x}_{n-1} \ldots \vec{x}_{n-N+1}]$$

are the thermometer-coded values of the input signals.
In effect this means $$ã_{j,k}(\vec{x}_{n-j}) = ã_{j,k}(\vec{x}_{n-j}) + \mu \epsilon_n x_{n-k}$$

where the update to memory bank j column k at address indexed by $\vec{x}_{n-j}$ is a function of the error $\epsilon_n$ multiplied by the signal $x_{n-k}$ to which the output of this column had contributed in forming the coefficient $ã_{j,k}(\vec{x}_{n-j})$.

The feedback loop for coefficients stored in memory bank 206d is illustrated in detail in FIG. 2. In the feedback loop shown, input samples $x_n$, $x_{n-1}$, $x_{n-2}$, and $x_{n-3}$ are each multiplied with $\mu \epsilon_n$. The results are delayed and added to the coefficient vector in memory bank 206d that is currently selected based on the current memory location of $\vec{x}_{n-3}$. Referring to the detailed implementation example shown in FIG. 3, the values in row [0.2 0.1 2.4 0.5] are updated based on the results of update function [6]. Similarly, the values in other selected rows of the other memory banks are also updated, although the feedback loops are omitted to keep the diagram clear. In the following discussion, the feedback loops are sometimes omitted from the figures even though in practice the feedback loops are included and the same principles of feedback and update apply.

A filter system similar to 200 is a cost effective way of implementing the theoretically optimal Volterra series expansion and as well as Weiner-Hammerstein models that include memory dispersion. In some embodiments, a filter with N taps is used, where each tap k has the form of equation [3], i.e., the coefficient function $$ã_k(X_n) = \left[\sum_{j=0}^{N-1} ã_{j,k}(x_{n-j})\right],$$

in which $ã_{j,k}(x_{n-j})$ is an arbitrarily complex nonlinear function of the variable $x_{n-j}$. Using Volterra series expansion, $ã_{j,k}(x_{n-j})$ can be expressed to arbitrary precision using an $m^{th}$ order polynomial of $x_{n-j}$. Similarly, all the $x_{n-j}$'s in tap k (where j=0, 1, . . . N−1) can also be expressed to arbitrary precision. For example, the coefficient $ã_{j,k}(x_{n-j})$ can be written as a $5^{th}$ order polynomial $$ã_{j,k}(x_{n-j}) = x_n + x_n^2 + x_n^3 + x_n^4 + x_n^5 \qquad [7]$$

where the weights of the coefficients are assumed to be 1 for the sake of simplicity but may vary in practice. Accordingly, $$ã_k(X_n) = x_n + x_n^2 + x_n^3 + x_n^4 + x_n^5 + x_{n-1} + x_{n-1}^2 + x_{n-1}^3 + x_{n-1}^4 + \qquad [8]$$
$$x_{n-1}^5 + \vdots\ x_{n-N+1} + x_{n-N+1}^2 + x_{n-N+1}^3 + x_{n-N+1}^4 + x_{n-N+1}^5$$

The $k^{th}$ coefficient $ã_k(X_n)$ expressed as equation [8] is multiplied by $x_{n-k}$, forming a polynomial with cross terms comprising $x_{n-k-j}$ multiplied with $x_{n-k}$ for j=0, 1, . . . , N−1. Thus, the nonlinear function is a true Volterra expansion of arbitrarily high degree and has memory. For example, when k=0, the function includes all cross terms of $x_n$, and for k=1 the function includes all cross terms of $x_{n-1}$, and so on.

In some embodiments, rather than storing all the coefficients in memory, filter coefficient functions including construction functions such as Radial Basis Functions (RBF), cubic splines, or sinc functions are used to provide the coefficients. The construction functions include windowed interpolation functions that use weighting coefficients and distance from function origins to generate interpolation values. In a construction function, discrete sample values are summed to generate a smoothed approximation of a background function and values between sample points. The general format for a construction function is:

$$v(x) = \sum_{i=1}^{L} w_i \Phi(\|x - c_i\|) \qquad [9]$$

where $c_i$ are the centers of the RBF and $w_i$ are the coefficients.
An example of a RBF is:

$$v_n(x) = \sum_{i=1}^{L} w_i \mathrm{Exp}(-\gamma \|x_n - c_i\|) = W_n E_n^T$$

where γ is a constant that determines the shape of the RBF. The coefficients are adapted according to the following:

$$W_{n+1}=W_n+\mu\epsilon_n E_n$$

where $W_n=[w_{1,n} \ldots w_{L,n}]$ and $E_n=[\text{Exp}(-\gamma\|x_n-c_1\|) \ldots \text{Exp}(-\gamma\|x_n-c_L\|)]$ Thus, the filter can be implemented using RBF components instead of implementing the polynomial of equation [7] as an actual polynomial structure or storing the coefficients in a lookup table. This implementation allows for tradeoffs be made between the amount of memory and the number of multiplications required. For example, let $$\tilde{a}_{j,k}(x_{n-j}) = x_n + x_n^2 + x_n^3 + x_n^4 + x_n^5 = \sum_{i=1}^{L} w_i \text{Exp}(\|x_n - c_i\|) \quad [10]$$

In some embodiments, the number of centers L is chosen depending on the desired accuracy and the multiplication requirements.

Note that when a signal x lies on the center c, the coefficient w corresponds to what is stored in memory since Exp $(\|x_n-c_i\|)=1$. This means that a RBF can be used in conjunction with stored values to provide interpolation between quantization levels of x. Since only a few adjacent locations contribute to the interpolated result at x, the amount of processing required by the RBF in this case is less than if no stored values were used.

Figure 4A:
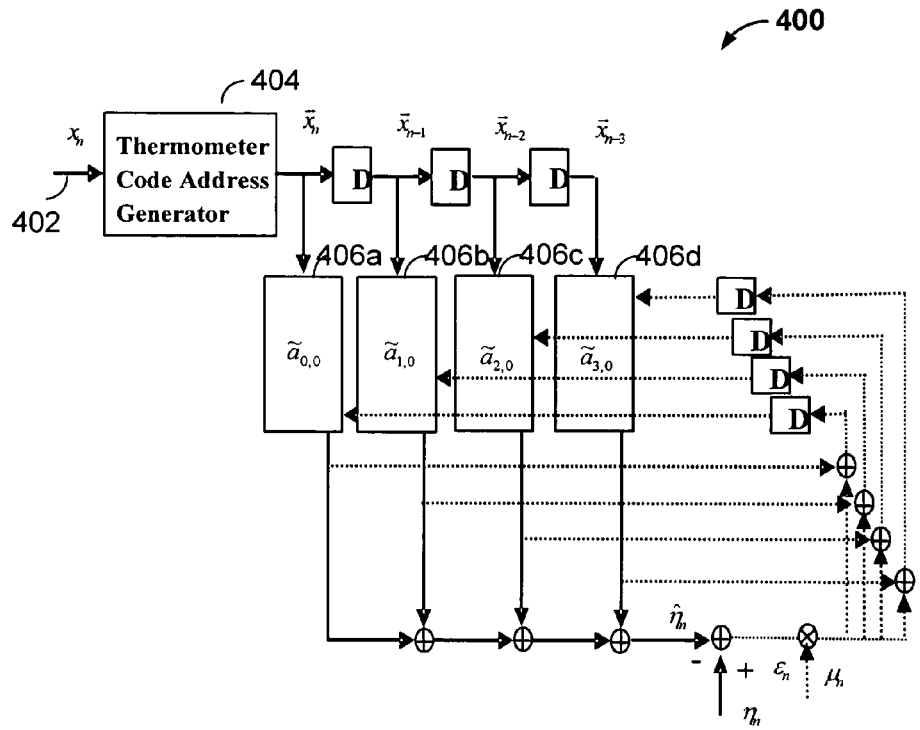
FIG. 4A is a block diagram illustrating another embodiment of a simplified adaptive nonlinear filter.

In an N-tap filter embodiment similar to filter 200 described above, the output is obtained with a convolution function that requires N multiplications. The number of multiplications can be reduced in some embodiments by simplifying the expression for the coefficients. FIG. 4A is a block diagram illustrating another embodiment of a simplified adaptive nonlinear filter. In simplified filter 400, each tap k corresponds to a polynomial function of the signal $x_{n-j}$ without multiplication with other cross terms. The simplified filter structure is expressed as:

$$\tilde{A}(X_n)=[\tilde{a}_{0,0}(x_n)\tilde{a}_{1,0}(x_{n-1}) \ldots \tilde{a}_{N-1,0}(x_{n-N+1})] \quad [11].$$

The output is expressed as:

$$y_n=\tilde{a}_{0,0}(x_n)+\tilde{a}_{1,0}(x_{n-1})+\ldots+\tilde{a}_{N-1,0}(x_{n-N+1}) \quad [12].$$

In other words, each filter tap k implements a corresponding function $\tilde{a}_k$ of $_k x_{n-}$. Filter function [12] does not require any multiplication and is computationally inexpensive. To implement the filter, the possible range of inputs $\vec{\beta}=\{\beta_{min}, \beta_{max}\}$ is divided into S subranges based on the desired function granularity/precision. Each input subrange k maps to a corresponding function $\tilde{a}_k(x_{n-k})$. Rather than storing vectors that correspond to the subranges as was shown in FIG. 3, memory banks 406a-d in this example store functions that correspond to the subranges. For example, if there are 4 subranges, then 4 values of the functions $\tilde{a}_{k,0}(x_{n-k,0})$, $\tilde{a}_{k,0}(x_{n-k,1})$, $\tilde{a}_{k,0}(x_{n-k,2})$, and $\tilde{a}_{k,0}(x_{n-k,3})$ are stored in the k-th memory bank.

The input $x_n$ received on input interface 402 is sent to a thermometer code address generator 404, which generates an appropriate output vector according to equation [4]. The vector is used to locate a value $\tilde{a}_{0,0}(x_{n,j0})$ in memory bank 406a that maps to the input, where j0 depends on the subrange in which the input is located. Similarly, thermometer coded and delayed input samples are used to locate in memory banks 406b, 406c, and 406d function values $\tilde{a}_{1,0}(x_{n-1,j1})$, $\tilde{a}_{2,0}(x_{n-2,j2})$, and $\tilde{a}_{3,0}(x_{n-3,j3})$, respectively.

Figure 4B:
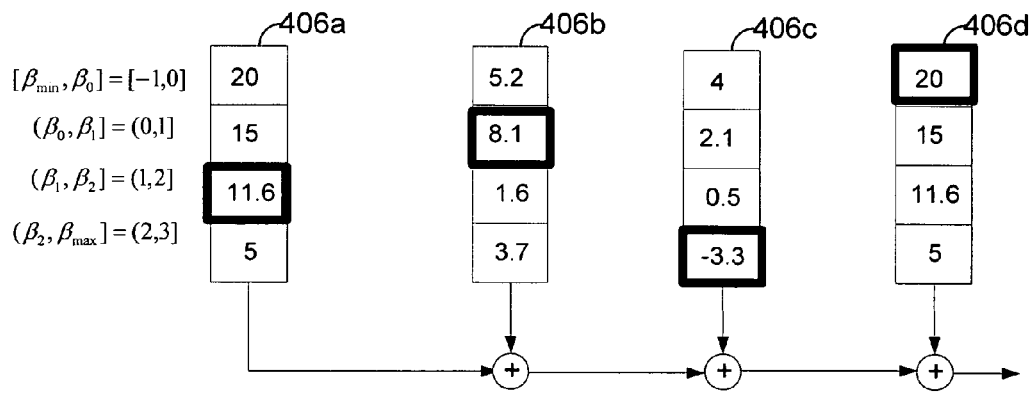
FIG. 4B is a diagram illustrating in greater detail an example implementation of memory banks 406a-406d of FIG. 4A.

FIG. 4B is a diagram illustrating in greater detail an example implementation of memory banks 406a-406d of FIG. 4A. In the example show, memory banks 406a-406d are implemented as four 4×1 matrices. Values stored in rows that correspond to the thermometer coded input addresses are selected and summed.

Returning to FIG. 4A, the selected values are summed to generate output $\hat{\eta}_n$. Since the function values are obtained by mapping the input to stored function values, multiplication is not required for generating the output. The output is subtracted from the target signal $\eta_n$ to obtain an error signal $\epsilon_n$. The error signal is multiplied with update coefficient μ, and the result is fed back to adapt the filter coefficients. The update function of the adaptive filter is expressed as:

$$\tilde{a}_{j,0}(x_{n-1})=\tilde{a}_{j,0}(x_{n-1})+\mu\epsilon_n \quad [13]$$

Figure 5:
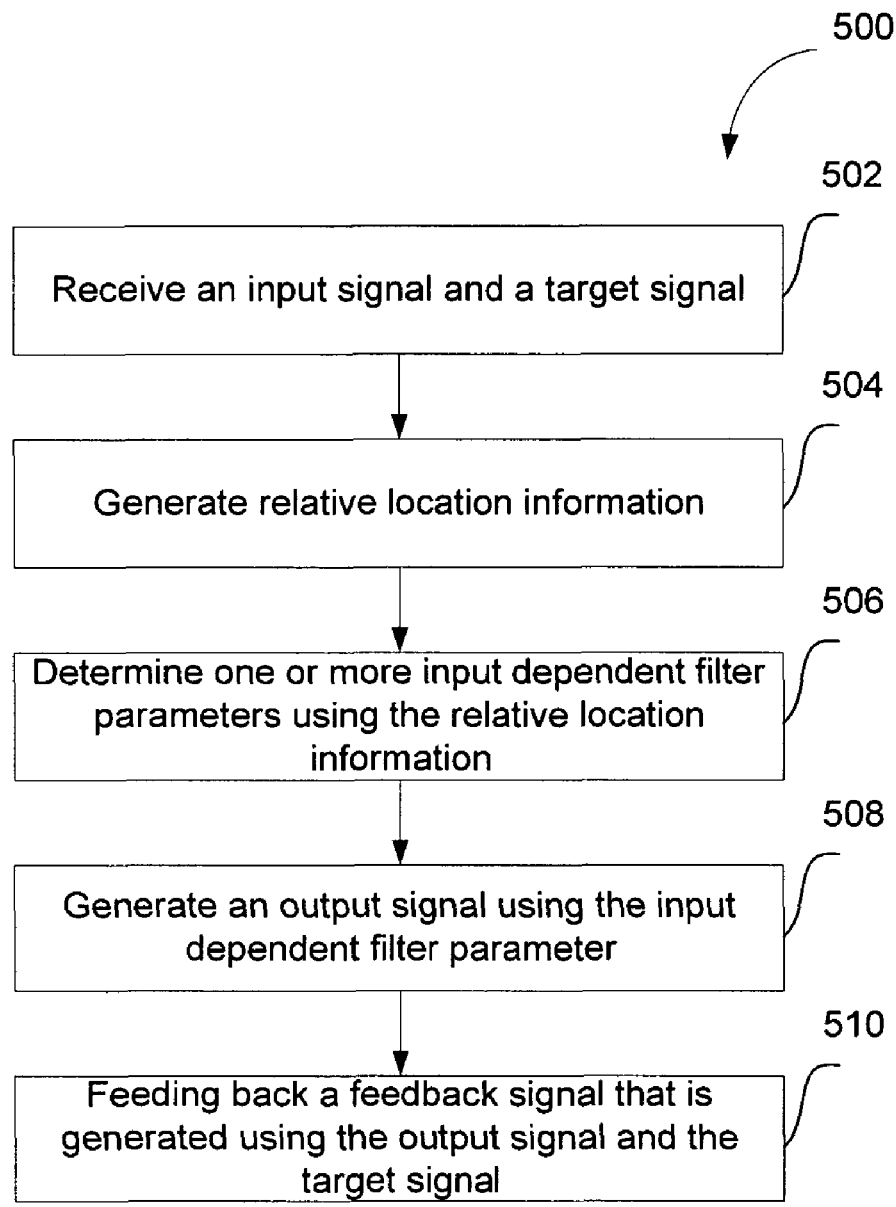
FIG. 5 is a flowchart illustrating an embodiment of a process for operating an adaptive nonlinear filter.

FIG. 5 is a flowchart illustrating an embodiment of a process for operating an adaptive nonlinear filter. Process 500 may be implemented on an adaptive filter system such as 200 or 400, as well as other embodiments discussed below. At 502, an input signal and a target signal are received. At 504, a relative location of the input signal within a range of possible inputs is determined. For example, in embodiments 200 and 400, a location vector is generated by the thermometer code address generator. The location vector indicates the relative location of the input signal, which corresponds to the subrange within which the input is located. At 506, one or more input dependent filter parameters are determined, using the relative location information of the input. For example, in embodiment 200, filter coefficients are computed using vectors selected from memory banks, based on the relative location of the input. In embodiment 400, functions $\tilde{a}_k(x_{n-k})$ or their mapped values are selected from memory banks, based on the relative location of the input.

At 508, an output signal is generated using the input dependent filter parameter. In embodiment 200, for example, the output signal is generated by multiplying the filter coefficients with the input samples and summing the results. In embodiment 400, the output signal is generated by summing results of the functions selected from the memory banks. At 510, a feedback signal is generated and fed back to the system. The feedback signal is based at least in part on the output signal and the target signal. In embodiment 200, the feedback signal is used to update the coefficients stored in the memory banks. In embodiment 400, the feedback signal is used to update the functions or function values stored in the memory banks.

Figure 6:
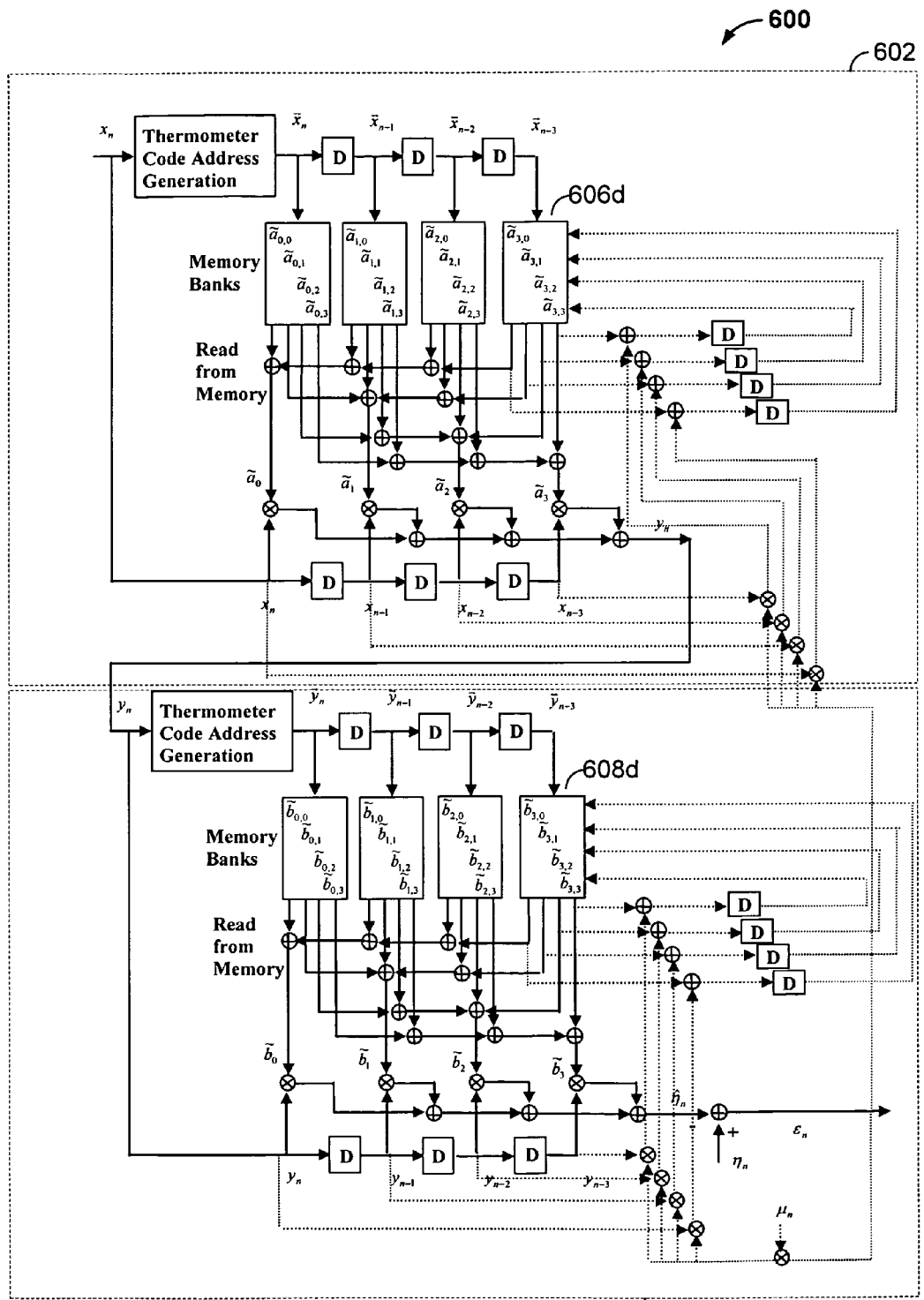
FIG. 6 is a block diagram illustrating an embodiment of a cascaded nonlinear filter.

In some embodiments, multiple adaptive nonlinear filters are cascaded to form filter functions that are nonlinear functions of nonlinear functions. FIG. 6 is a block diagram illustrating an embodiment of a cascaded nonlinear filter. Adaptive nonlinear filter 600 includes a first adaptive nonlinear filter 602, whose output is sent to the input of a second adaptive nonlinear filter 604. In other embodiments, there may be more than two cascaded adaptive nonlinear filters.

Let filter 602 be expressed as:

$$y_n=\tilde{a}_0(X_n)x_n+\tilde{a}_1(X_n)x_{n-1}+\ldots+\tilde{a}_{N-1}(X_n)x_{n-N+1} \quad [14]$$

where $X_n=[x_n \ldots x_{n-N+1}]$.

Filter 604 is expressed as:

$$w_n \tilde{b}_0(Y_n)y_n+\tilde{b}_1(Y_n)y_{n-1}+\ldots+\tilde{b}_{N-1}(Y_n)y_{n-N+1} \quad [15]$$

where $Y_n=[y_n \ldots y_{n-N+1}]$.

Thus, $$w_n=\tilde{b}_0(Y_n)\tilde{A}_n X_n+\tilde{b}_1(Y_n)\tilde{A}_{n-1}X_{n-1}+ \quad . \quad . \quad . \quad + \\ \tilde{b}_{N-1}(Y_n)\tilde{A}_{n-N+1}X_{n-N+1} \quad [16]$$

$X_{n-j}$ in equation [16] corresponds to vector $\lfloor x_{n-j} \ldots x_{n-j-N+1} \rfloor$, which has a length of N. The resulting cascaded filter function $w_n$ is a nonlinear function of $[x_n \ldots x_{n-2N+1}]$, which has a length of 2N−1. The cascaded filter of length 2N−1 requires less memory than a single uncascaded filter of length 2N. Suppose the input range is divided into S subranges, then 2N×S coefficients are required by a cascaded filter such as 600. In contrast, a single uncascaded filter of length 2N would require 2N×2N×S coefficient entries. Thus, the cascade filter comprising two length-N filters requires ½ of the amount of memory required by an uncascaded length-2N filter. More generally, a cascaded filters comprising L filter taps requires 1/L as much memory as an uncascaded filter of approximately the same length.

The feedback loops of filters 602 and 604 are similar to the feedback loop shown in FIG. 2. Only the feedback loops of memory banks 606d and 608d are illustrated in the diagram and the feedback loops of other memory banks are not shown. The cascaded filter is adapted according to the following:

$$\tilde{b}_j(Y_n) = \tilde{b}_j(Y_n) + \mu \epsilon_n y_{n-j} \quad [17]$$

$$\tilde{a}_j(X_n) = \tilde{a}_j(X_n) + \mu \epsilon_n x_{n-j} \quad [18]$$

Figure 7:
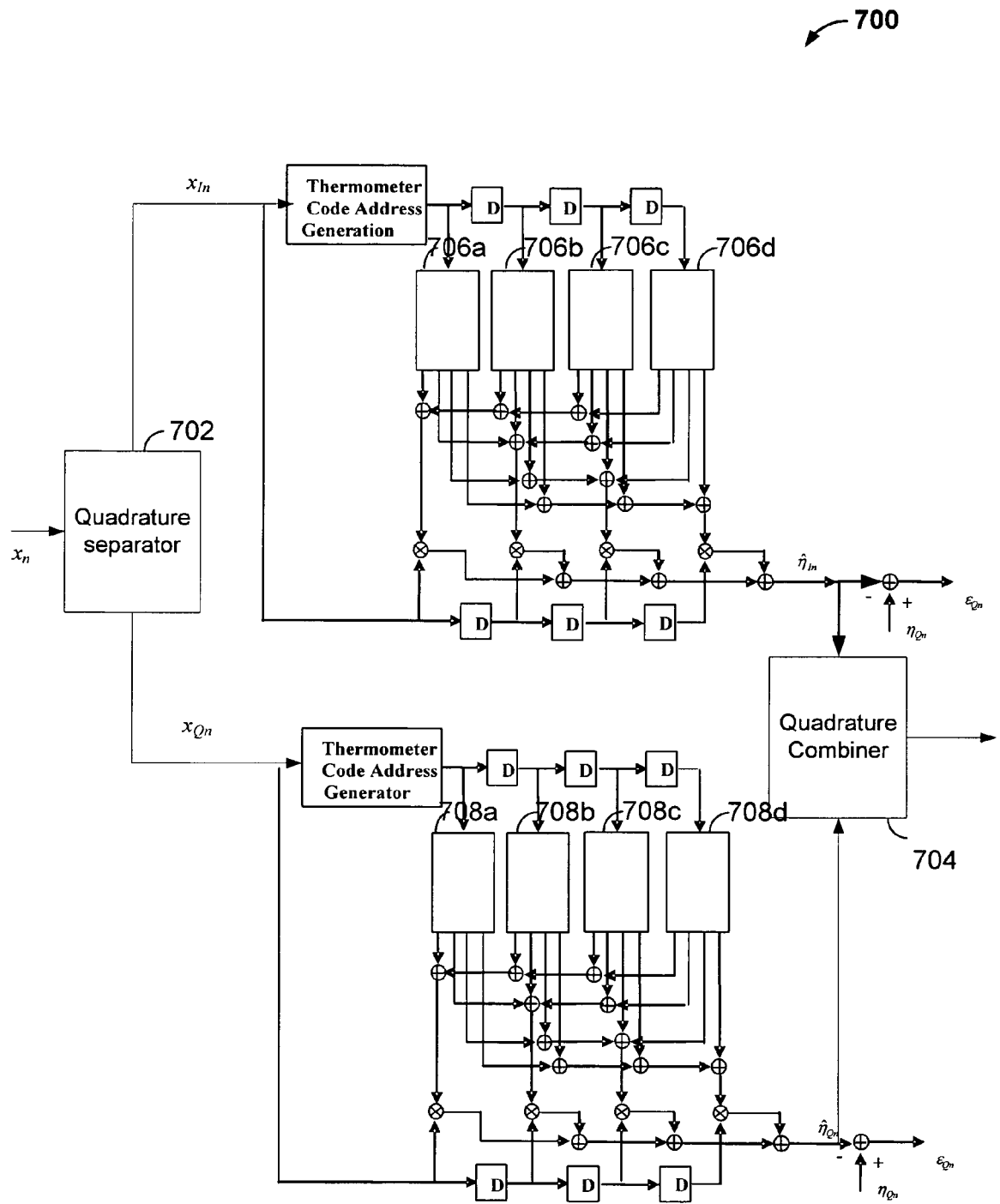
FIG. 7 is a block diagram illustrating another embodiment of an adaptive nonlinear filter.

In some embodiments, an adaptive nonlinear filter is configured to handle complex signals. FIG. 7 is a block diagram illustrating another embodiment of an adaptive nonlinear filter. In this example, adaptive nonlinear filter 700 includes a quadrature separator 702 that separates the signal into in-phase (I) and quadrature phase (Q) components. The adaptive nonlinear filter 700 further includes two adaptive filter modules in a parallel configuration for processing the I and Q components. I and Q components are sent to their respective respective thermometer code address generators. The coded output for signal $x_{In-j}$ is used as a memory address for selecting a vector $\tilde{A}_{In-j}(x_{In-j})$ from memory banks 706a-d. Similarly, the coded output for signal $x_{Qn-j}$ is used to select a vector $\tilde{A}_{Qn-j}(x_{Qn-j})$ from memory banks 708a-d. The outputs from I and Q branches $\hat{\eta}_{In}$ and $\hat{\eta}_{Qn}$ are combined by a quadrature combiner 704.

Filter 700 is expressed as:

$$y_{In} = \tilde{a}_{I0}(X_n)x_{In} + \tilde{a}_{I1}(X_{n-1})x_{In-1} + \ldots + \quad [19I]$$
$$\tilde{a}_{IN-1}(X_{n-N+1})x_{In-N+1} + \tilde{a}_{Q0}(X_n)x_{Qn} + \tilde{a}_{Qn} +$$
$$\tilde{a}_{Q1}(X_{n-1})x_{Qn-1} + \ldots + \tilde{a}_{QN-1}(X_{n-N+1})x_{Qn-N+1} =$$
$$[\tilde{A}_{I0}(x_{In}) + \tilde{A}_{I1}(x_{In-1}) + \ldots + \tilde{A}_{IN-1}(x_{In+N+1}) +$$
$$\tilde{A}_{Q0}(x_{Qn}) + \tilde{A}_{Q1}(x_{Qn-1}) + \ldots + \tilde{A}_{QN-1}(x_{Qn-N+1})]$$
$$X_n = \left[\sum_{j=0}^{N-1} \left(\tilde{A}_{In-j}(x_{In-j}) + \tilde{A}_{Qn-j}(x_{Qn-j})\right)\right] X_n = \tilde{A}_{In} X_n$$

and $$y_{In} = \tilde{a}_{I0}(X_n)x_{Qn} + \tilde{a}_{I1}(X_{n-1})x_{Qn-1} + \quad [19Q]$$
$$\ldots + \tilde{a}_{IN-1}(X_{n-N+1})x_{Qn-N+1} - \tilde{a}_{Q0}(X_n)x_{In} -$$
$$\tilde{a}_{Q1}(X_{n-1})x_{In-1} - \ldots - \tilde{a}_{QN-1}(X_{n-N+1})x_{In-N+1} =$$
$$\left[\sum_{j=0}^{N-1} \left(\tilde{A}_{In-j}(x_{Qn-j}) - \tilde{A}_{Qn-j}(x_{In-j})\right)\right] X_n = \tilde{A}_{Qn} X_n$$

$\hat{\eta}_{In}$ and $\hat{\eta}_{Qn}$ are subtracted from I and Q components of the target signal, $\eta_{In}$ and $\eta_{Qn}$, respectively, to generate error signals $\epsilon_{In}$ and $\epsilon_{Qn}$. The errors are fed back to update the stored coefficients. The feedback loops are similar to those of FIG. 2 and are not shown in the diagram.

2N multiplications are required to generate output term $y_{In}$ and 2N additional multiplications are required for the updates associated with the memory banks storing the coefficients for the I component. Similarly, a total of 4N multiplications are also required to generate output term $y_{Qn}$ and to update the memory banks storing the coefficients for the Q component.

Figure 8:
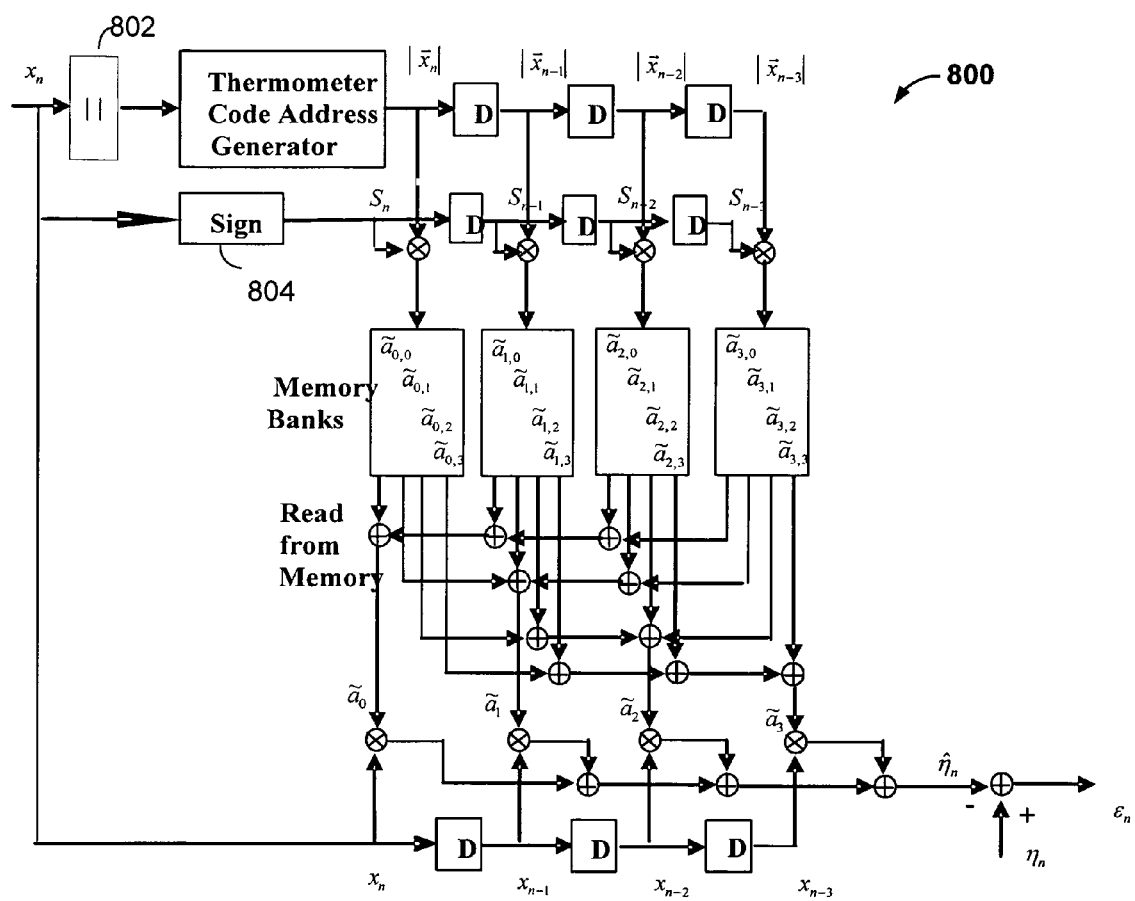
FIGS. 8 and 9 are block diagrams illustrating embodiments of adaptive nonlinear filters that handle even and odd harmonic distortions, respectively.
Figure 9:
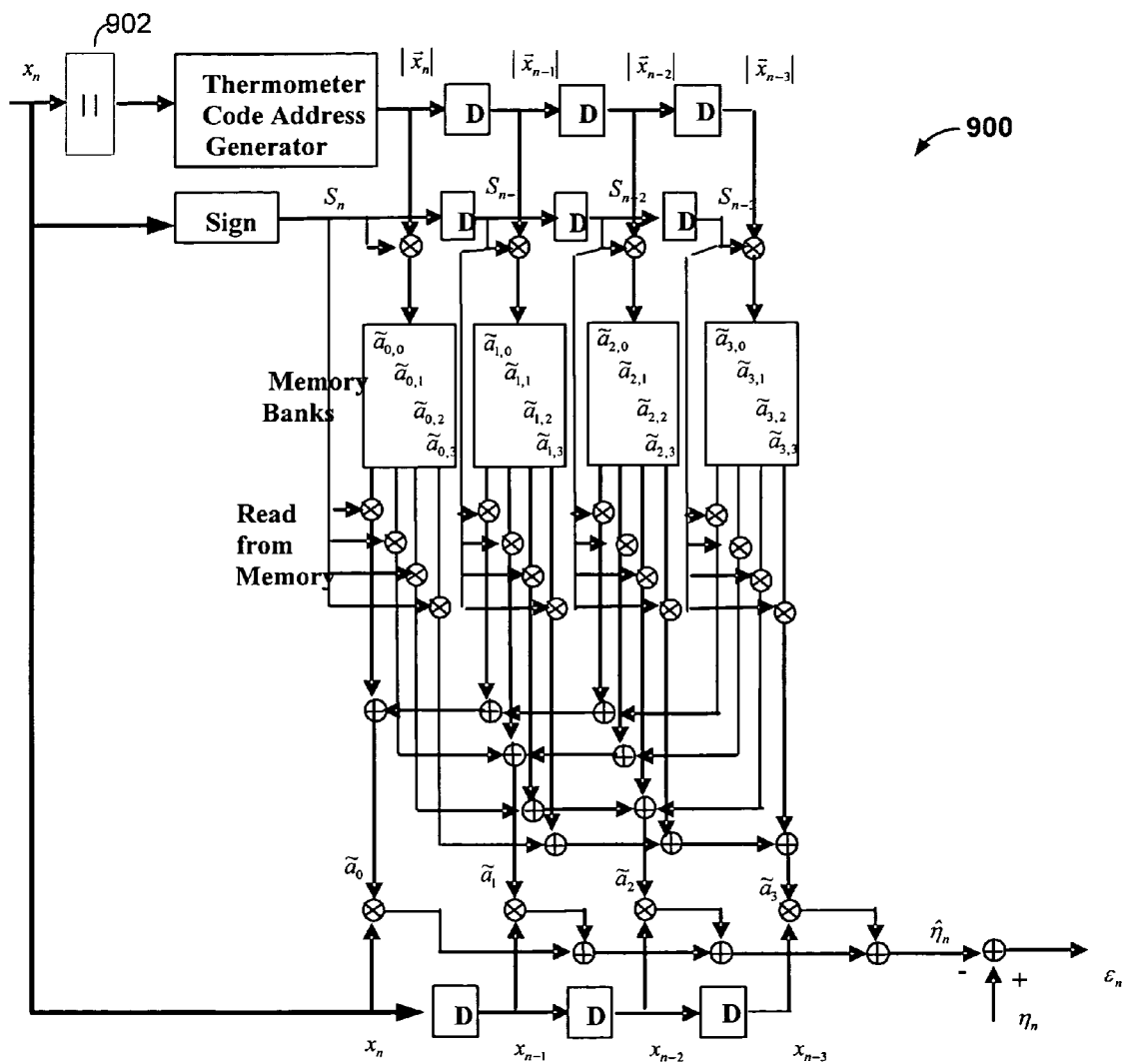

In some embodiments, the adaptive nonlinear filter is configured to handle even or odd harmonic distortions in the target signal. Whether a harmonic distortion is even or odd depends on the frequency location of the distortion relative to the desired signal, i.e. whether the distortion occurs at an even or an odd multiple of the desired frequency. FIGS. 8 and 9 are block diagrams illustrating embodiments of adaptive nonlinear filters that handle even and odd harmonic distortions, respectively. In the examples shown, filters 800 and 900 each include an absolute value operator (802 and 902, respectively) coupled to their respective input terminals. The thermometer code address generator generates an output according to the following:

$$\vec{x}_{n-j} = \text{Sign}(|x_{n-j}| - \vec{\beta}) \quad [20]$$

Filters 800 and 900 further include sign operators 804 and 904, respectively. The sign operator extracts the sign of the input, outputting either −1 or 1. In both filter embodiments, the sign of the input is multiplied with the thermometer code address, and the multiplication result is used as the address for selecting an appropriate coefficient vector from the corresponding memory bank. Delay elements and additional memory banks are included to provide coefficients for additional filter taps. In even harmonic filter 800, selected values from the memory banks are summed to generate appropriate filter coefficients. In odd harmonic filter 900, the selected values are multiplied with their corresponding sign values before they are summed to generate the filter coefficients. The general expression for this type of N-tap filter is:

$$y_n = \left[s_{0n}\tilde{A}_0(|x_n|) + s_{1n}\tilde{A}_1(|x_{n-1}|) + \ldots + \quad [21] \right.$$
$$\left. s_{N-1n}\tilde{A}_{N-1}(|x_{n-N+1}|)\right] X_n = \left[\sum_{j=0}^{N-1} s_{jn}\tilde{A}_{n-j}(|x_{n-j}|)\right] X_n = \tilde{A}_n X_n$$

where $s_{jn} = 1$ for an even harmonic filter such as 800, and $s_{jn} = \text{Sign}(x_{n-j})$ for an odd harmonic filter such as 900. A converged output signal of 800 has even harmonics that are approximately equal to the even harmonics of the target signal, although its odd harmonics are not necessarily close to the odd harmonics of the target. The resulting output signal of 900 has odd harmonics that are approximately the same as the odd harmonics of the target signal, although its even harmonics are not necessarily the same as those of the target signal.

The filter coefficients are updated according to the following:

$$S_n \circ \tilde{A}_{n+1-j} = S_n \circ \tilde{A}_{n-j} + \mu \epsilon_n |X_n| \quad [22]$$

where
$S_n = \lfloor s_n \ s_{n-1} \ldots s_{n-N+1} \rfloor$ and $\circ$ is the operator for element-by-element multiply.

In some embodiments, an even harmonic filter and an odd harmonic filter are combined to form a composite filter that handles both even and odd harmonics. Components such as the absolute value operator, the thermometer code address generator, and the sign operator can be shared by the odd and even filter branches.

Figure 10A:
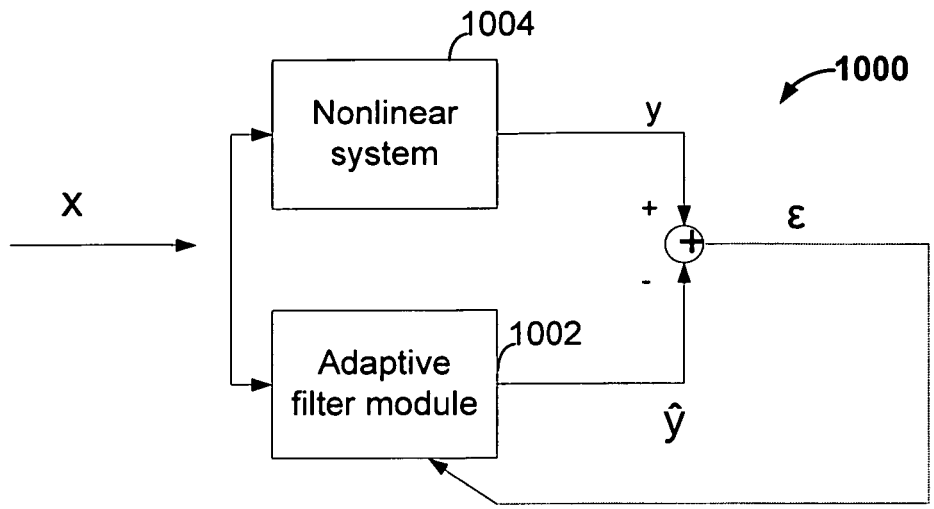
FIGS. 10A-10C are block diagrams illustrating several example applications that employ nonlinear adaptive filters.
Figure 10B:
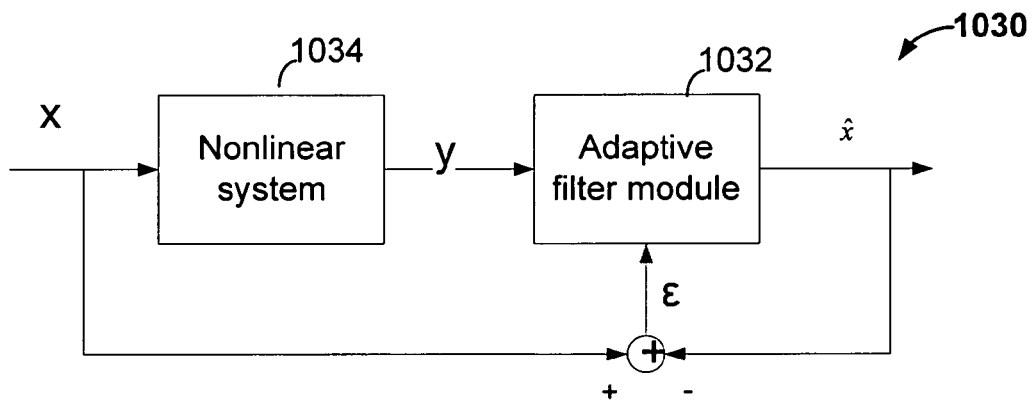
Figure 10C:
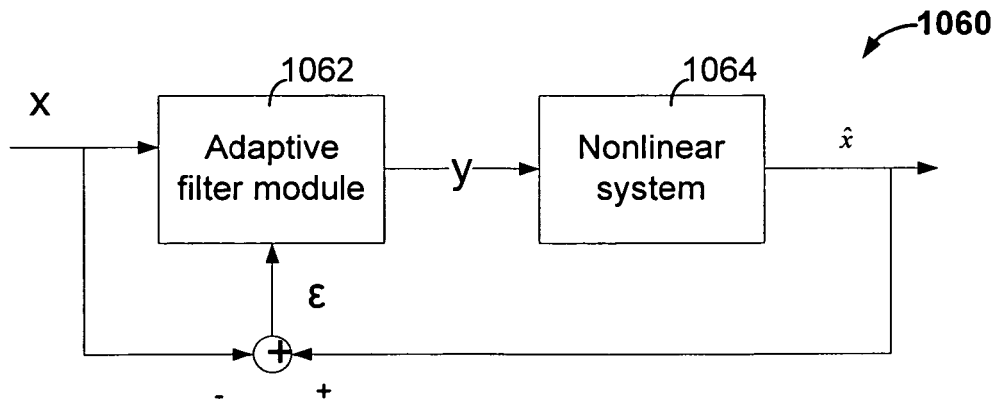

Nonlinear adaptive filters are used in many applications. FIGS. 10A-10C are block diagrams illustrating several example applications that employ nonlinear adaptive filters. Many other systems and configurations are possible. In example systems 1000, 1030, and 1060, adaptive filter modules 1002, 1032, and 1062 may be implemented using any of the adaptive filter module embodiments described above. Modules 1002, 1032 and 1062 are coupled to nonlinear systems 1004, 1034, and 1064. The nonlinear systems can be any type of nonlinear system whose output signal y is a nonlinear function of input signal x, for example nonlinear channels such as communication channels with channel distortion, nonlinear components such as electrical and/or optical devices (e.g., amplifiers, transceivers) that process and/or propagate the input signals, or combinations thereof. In some embodiments, one or more analog to digital converters and/or digital to analog converters are included with the nonlinear system to ensure compatibility between digital and analog components. The adaptive filter modules in the example systems and their corresponding feedback loops are configured differently depending on the functions performed.

In example system 1000 of FIG. 10A, adaptive filter module 1002 performs a modeling function to model the function of nonlinear system 1004. In this example, input x of system 1004 is also sent to 1002 as the adaptive filter's input, and output y of system 1004 is sent to filter 1002 as the target signal. Adaptive filter module 1002 adapts its filter coefficients to drive its output ŷ close to y, forming a filter whose filter function approximates the nonlinear function of system 1004. In other words, adaptive filter module 1002 continuously adapts its coefficients based on the feedback error signal $\epsilon$ (which is the difference between nonlinear system 1004's output y and adaptive filter module 1002's output ŷ), until the error is less than or equal to a predetermined value $\epsilon_0$.

In example system 1030 of FIG. 10B, adaptive filter module 1032 performs post-distortion correction function to compensate for distortion previously introduced by nonlinear system 1034. The input signal of adaptive filter module 1032 is the output of system 1034, y. The target signal of adaptive filter module 1032 is the input to system 1034, x. Adaptive filter module 1032 adapts its coefficients, driving its output x̂ close to the target signal x. Thus, the filter function of adaptive filter module is approximately the inverse function of nonlinear system 1034, and distortions introduced by nonlinear system 1034 are corrected.

In example system 1060 of FIG. 10C, adaptive filter module 1062 performs pre-distortion correction function to compensate for distortion that is later introduced by nonlinear system 1064. The input signal to adaptive filter module 1062 is the same as the input to the entire system, x. The output of the adaptive filter module is the input to nonlinear system 1064. The target signal to the adaptive filter module is the output of nonlinear system 1064, x̂. Adaptive filter module 1062 adapts its coefficients to drive the output of nonlinear system 1064 x̂ close to the input signal x. Since the filter function of adaptive filter module is approximately the inverse of nonlinear system 1064's filter function, the output signal y is pre-compensated before it is sent to nonlinear system 1064, and distortions introduced by the nonlinear system are corrected.

Adaptive nonlinear filtering has been described. The technique allows nonlinear filter functions to be implemented using relatively simple elements such as memory banks and/or arithmetic operators, and has relatively inexpensive computational requirements.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An adaptive nonlinear filtering system comprising:
a first interface configured to receive an input signal;
a second interface configured to receive a target signal;
an adaptive filter module coupled to the first interface, configured to:
 divide a range of possible input values of the input signal into a plurality of subranges;
 determine the subrange within which a value of the input signal falls;
 determine an input dependent filter parameter based at least in part on the determined subrange;
 generate an output signal based at least in part on the input dependent filter parameter; and
feed back a feedback signal that is generated based at least in part on the output signal and the target signal.

2. The system of claim 1, wherein the adaptive filter module is further configured to:
determine a delayed subrange pertaining to a subrange within which a delayed input signal falls; and
wherein the input dependent filter parameter is determined further based at least in part on the delayed subrange.

3. The system of claim 1, wherein the input dependent filter parameter includes a filter coefficient value.

4. The system of claim 1, wherein the input dependent filter parameter includes a filter coefficient function.

5. The system of claim 1, wherein the input dependent filter parameter includes a construction function.

6. The system of claim 1, wherein the adaptive filter module includes a memory bank.

7. The system of claim 6, wherein the input range is divided into S subranges, and the memory bank stores S sets of values.

8. The system of claim 1, wherein the adaptive filter module includes a plurality of memory banks.

9. The system of claim 6, wherein the adaptive filter module is further configured to adapt a value stored in the memory bank.

10. The system of claim 8, wherein the adaptive filter module is further configured to:
determine a delayed subrange pertaining to a subrange within which a delayed input signal falls; and
wherein determining the input dependent filter parameter includes:
 selecting a first value from a first one of the plurality of memory banks using the determined subrange;
 selecting a second value from a second one of the plurality of memory banks using the delayed subrange; and
 summing the first value and the second value.

11. The system of claim 10, wherein the input dependent filter parameter includes a filter coefficient that is dependent at least in part on a sum of the first value and the second value.

12. The system of claim 1, wherein the adaptive filter module includes N filter taps, the adaptive filter module includes N memory banks, and N is an integer that is greater than 1.

13. The system of claim 8, wherein:
the input dependent filter parameter is a first input dependent filter parameter;
determining the first input dependent filter parameter includes selecting a first function from a first one of the plurality of memory banks using the relative location information;
the adaptive filter module is further configured to:
 determine a delayed subrange pertaining to a subrange within which a delayed input signal falls; and determine a second input dependent filter parameter, including by selecting a second function from a second one of the plurality of memory banks using the delayed subrange.

14. The system of claim 13, wherein the output signal is generated based at least in part on a sum of the first and the second input dependent filter parameters.

15. The system of claim 1, wherein the input range is divided into S subranges, and S depends on a granularity of a nonlinear function implemented by the adaptive filter module.

16. The system of claim 1, wherein the adaptive filter module is a first adaptive filter module, and the system further comprises a second adaptive filter module that is coupled to the first adaptive filter module in a cascaded configuration.

17. The system of claim 1, wherein the input signal is an in-phase (I) component of a received signal.

18. The system of claim 17, wherein the adaptive filter module is a first adaptive filter module configured to process the I component, and the system further includes a second adaptive filter module configured in parallel with the first adaptive filter module to process a quadrature phase (Q) component of the received signal.

19. The system of claim 1, wherein the adaptive filter module includes a thermometer code address generator that is configured to determine the subrange.

20. The system of claim 19, wherein the adaptive filter module further includes an absolute value operator coupled to the thermometer code address generator.

21. The system of claim 19, wherein the adaptive filter module further includes a sign operator.

22. The system of claim 1, wherein the output signal includes odd harmonics that are approximately equal to the odd harmonics of the target signal.

23. The system of claim 1, wherein the output signal includes even harmonics that are approximately equal to the even harmonics of the target signal.

24. The system of claim 1, wherein:
the input signal is an input signal of a nonlinear system;
the target signal is an output signal of the nonlinear system; and
the adaptive nonlinear filtering system is configured to model the nonlinear system.

25. The system of claim 1, wherein:
the input signal is an output signal of a nonlinear system;
the target signal is an input signal of the nonlinear system; and
the adaptive nonlinear filtering system is configured to perform post-distortion correction on the nonlinear system.

26. The system of claim 1, wherein:
the output signal is an input of a nonlinear system;
the target signal is an output of the nonlinear system; and
the adaptive nonlinear filtering system is configured to perform pre-distortion correction on the nonlinear system.

27. A signal processing method, comprising:
receiving an input signal and a target signal;
generating relative location information corresponding to a relative location of a value of the input signal within a range of input values;
determining an input dependent filter parameter based at least in part on the relative location information;
generating an output signal based at least in part on the input dependent filter parameter; and
feeding back a feedback signal that is generated based at least in part on the output signal and the target signal,
wherein at least one of the above steps is performed by a processor.

28. An adaptive filter module comprising:
a memory bank storing a plurality of entries;
a thermometer code address generator coupled to the memory bank, the thermometer code address generator configured to generate relative location information corresponding to a relative location of a value of an input signal within a range of possible input values, the relative location information being used to select an entry from the memory bank, and the entry being used to generate an output signal; and
a feedback loop coupled to the memory bank, configured to update the memory bank using a feedback signal that is based at least in part on the output signal.

* * * * *